(12) United States Patent
Lim

(10) Patent No.: US 7,711,401 B2
(45) Date of Patent: May 4, 2010

(54) STATIC PREVENTING DEVICE AND MOBILE HANDSET HAVING THE SAME

(75) Inventor: Guk-Chan Lim, Gyeonggi-Do (KR)

(73) Assignee: LG Electronics Inc., Seoul (KR)

( * ) Notice: Subject to any disclaimer, the term of this patent is extended or adjusted under 35 U.S.C. 154(b) by 534 days.

(21) Appl. No.: 11/213,066

(22) Filed: Aug. 24, 2005

(65) Prior Publication Data

US 2006/0046772 A1  Mar. 2, 2006

(30) Foreign Application Priority Data

Aug. 31, 2004  (KR) .................. 10-2004-0069311

(51) Int. Cl.
*H04M 1/00* (2006.01)

(52) U.S. Cl. ............... 455/575.8; 455/550.1; 455/90.3; 455/575.1; 200/550; 200/181

(58) Field of Classification Search ............. 455/550.1, 455/572, 573, 575.1, 575.3, 575.4, 575.8, 455/90.3; 200/12, 181, 549, 550, 562, 563; 379/433.08

See application file for complete search history.

(56) References Cited

U.S. PATENT DOCUMENTS 5,383,097 A  1/1995  Delucia et al.
5,457,376 A * 10/1995  Chong et al. ................. 320/107
6,568,956 B1 * 5/2003  Holmberg .................... 439/500
6,580,043 B1 * 6/2003  Spratte ........................ 200/517
7,082,288 B2 * 7/2006  Hosoi ........................... 455/78
7,131,871 B1 * 11/2006  Zuo et al. .................... 439/630
7,146,198 B2 * 12/2006  Yu et al. ................... 455/575.1
7,336,978 B2 * 2/2008  Kim ........................... 455/574
2002/0032011 A1 * 3/2002  Park ............................ 455/90

FOREIGN PATENT DOCUMENTS

JP          59029355 A  *  2/1984
KR   10-20040054443 A       6/2004

* cited by examiner

*Primary Examiner*—Lana N Le
*Assistant Examiner*—Ping Y Hsieh
(74) *Attorney, Agent, or Firm*—Lee, Hong, Degerman, Kang & Waimey

(57) ABSTRACT

A mobile handset having a static preventing device comprises a handset body having components such as a PCB, a detachable battery, a locking member for securing the battery to or for releasing the battery from the handset body, a conductive contact plate located by the locking member, a ground provided at the battery for discharging static electricity, and a switching path from the conductive contact plate to the ground, wherein the switching path is operative when the battery is secured to or released from the handset body.

4 Claims, 6 Drawing Sheets

STATIC PREVENTING DEVICE AND MOBILE HANDSET HAVING THE SAME

CROSS-REFERENCE TO RELATED APPLICATIONS

This application claims the benefit of earlier filing date and right of priority to Korean Application No. 2004-0069311 filed on Aug. 31, 2004, respectively, the contents of which are hereby incorporated by reference herein in their entirety.

FIELD OF THE INVENTION

The present invention relates to a mobile handset, and more particularly, to a mobile handset having a static preventing device. The static preventing device prevents internal components of a mobile handset from being damaged or from malfunctioning due to static electricity caused by mounting components such as a memory card, a SIM card, or a battery.

BACKGROUND OF THE INVENTION

Generally, a mobile handset is a communication device capable of performing a voice transmission and reception with a remote party, and is generally simply carried by a user. Information communication technology has progressed and the mobile handset can also transmit/receive text messages, access the Internet, and receive TV signals. The mobile handset can also function as a camera capable of taking, transmitting, and receiving still photographs and motion videos. Additional uses for the mobile handset are being developed continuously.

The mobile handset generally has one of several form types—a bar type mobile handset, a flip type mobile handset, a folder type mobile handset, or a slider type mobile handset.

A battery supplies power to the mobile handset and the battery may be detached from the handset for charging in a separate charger, or when being replaced by a fully charged battery. A memory card for external memory also may be mounted in the handset body.

FIG. 1 is a disassembled perspective view showing a mobile handset in accordance with the conventional art, and FIG. 2 is a partial sectional view showing the mobile handset. As shown, the mobile handset comprises a body 100 having a certain shape, and a battery 200 detachably coupled to one side of the body 100 for supplying power.

The body 100 comprises a body casing 111 having a certain shape, a printed circuit board (PCB) 130 mounted in the body casing 111, and a key pad (not shown) mounted in the body casing 111. The body casing 111 comprises a front case 110 and a rear case 120 coupled to the front case 110. A compartment 121 for mounting the battery 200 is formed at the rear case 120.

Connection terminals 140 are formed on an inner side of the battery compartment 121, and the connection terminals 140 are connected to other components. A memory card slot 122 and a SIM card slot 123 are respectively formed on a surface of the battery compartment 121 for mounting a memory card 300 and a SIM card 310 respectively. The memory card 300 and the SIM card 310 are connected to chips inside the handset body 100 by signal lines in order to exchange data and signals.

The battery 200 comprises a battery body 210 formed to have a certain thickness and area, connection terminals 220, and a stopping groove 230. A battery latch for securing or releasing the battery 200 within the battery compartment 121 is provided on one side of the handset body 100.

The battery latch comprises a guide groove 124 having a certain length, a locking member 150 formed with a certain shape, and a spring 160 positioned in the handset body 100 for biasing the locking member 150 in the direction of the battery compartment 121. The guide groove 124 is penetratingly formed at one side of the handset body 100 and positioned at an edge of the battery compartment 121. The locking member 150 is coupled to the handset body 150 by spring 160 and is slideable within the guide groove 124.

The locking member 150 comprises a step portion 151 for insertion into the stopping groove 230 of the battery, a contact portion 152 for sliding within the guide groove 124, and a spring support portion 153. Spring 160 is disposed between locking member 150 and the handset body 100, and couples the locking member 150 to the handset body.

The mobile handset is used when the battery 200 is mounted within the battery compartment 121 and secured with the locking member 150. When the battery 200 is completely discharged, the locking member 150 is released thereby allowing the battery 200 to separate from the handset body 100. The battery 200 then may be charged in a separate charger, or a replacement battery may be inserted into the battery compartment 121.

The battery 200 is mounted to the handset body 100 as follows: the locking member 150 is slideably moved into the handset body 100 in a direction away from the battery compartment 121 thereby compressing spring 160, the battery 200 is inserted into the battery compartment 121, and the locking member 150 is released. The spring 160 biases the locking member 150 to the original position causing the step portion 151 to be inserted into the locking groove 230 thereby securing the battery 200 into the battery compartment 121.

The battery 200 is removed from the handset body 100 as follows: the locking member 150 is slideably moved into the handset body 100 in a direction away from the battery compartment 121 thereby compressing spring 160, the step portion 151 retracts from the locking groove 230 thereby releasing the battery 200 from the battery compartment 121. The battery 200 now may be separated from the handset body 100. The memory card 300 and SIM card 310 may be removed from or inserted into their respective slots 122 and 123 after the battery 200 is separated from the handset body 100.

However, in the conventional mobile handset, when the battery 200 is separated from the handset body 100, and the memory card 300 and the SIM card 310 are inserted into handset body 100, static electricity may be generated causing a potential difference between the cards and the handset body 100 or between the user and the handset body 100.

Static electricity discharges to components mounted within the handset body 100 through the memory card 300 or the SIM card 310 generating severe errors. To reduce the effect of static electricity and the associated errors, a static preventing circuit is provided as shown in FIG. 3. The static preventing circuit is constructed as a static preventing filter 315 connected between signal lines 325 and ground. Signal lines 325 provide signals between the SIM card 310 (or the memory card 300, not shown) to the components of the handset body 100. Ground lines 335 connect the static preventing filter 315 to ground.

However, the conventional static preventing circuit has a limitation in suppressing static electricity. The operational speed of communication lines 325 is dependent upon the capacitance associated of the communication lines 325, and because the static prevention filter 315 adds capacitance, the effective communication speed of lines 325 is reduced. Therefore, operating the communication lines 325 without reducing the communications speed increases the chance of erroneous communications. Data communication speed of line L1 is critical especially considering the enhanced performance and functionality of the mobile handset. Therefore, protecting the mobile handset hardware and software from the static electricity is important.

SUMMARY OF THE INVENTION

Therefore, an object of the present invention is to provide a mobile handset having a static preventing device capable of preventing the mobile handset internal components from being damaged or preventing the mobile handset from malfunctioning when static electricity is generated in the process of inserting a battery or memory card.

To achieve these and other objective, and in accordance with the purpose of the present invention, as embodied and broadly described herein, a mobile handset having a static preventing device comprises: a handset body; a battery mounted on the handset body; a locking member for securing the battery to the handset body; a conductive contact plate provided at the locking member; a ground for discharging static; and a switching path connecting the conductive contact plate to the ground.

The foregoing and other objects, features, aspects and advantages of the present invention will become more evident from the following detailed description of the present invention when taken in conjunction with the accompanying drawings.

DETAILED DESCRIPTION OF THE INVENTION

Reference will now be made in detail to embodiments of the present invention, examples of which are illustrated in the accompanying drawings.

Figure 4:
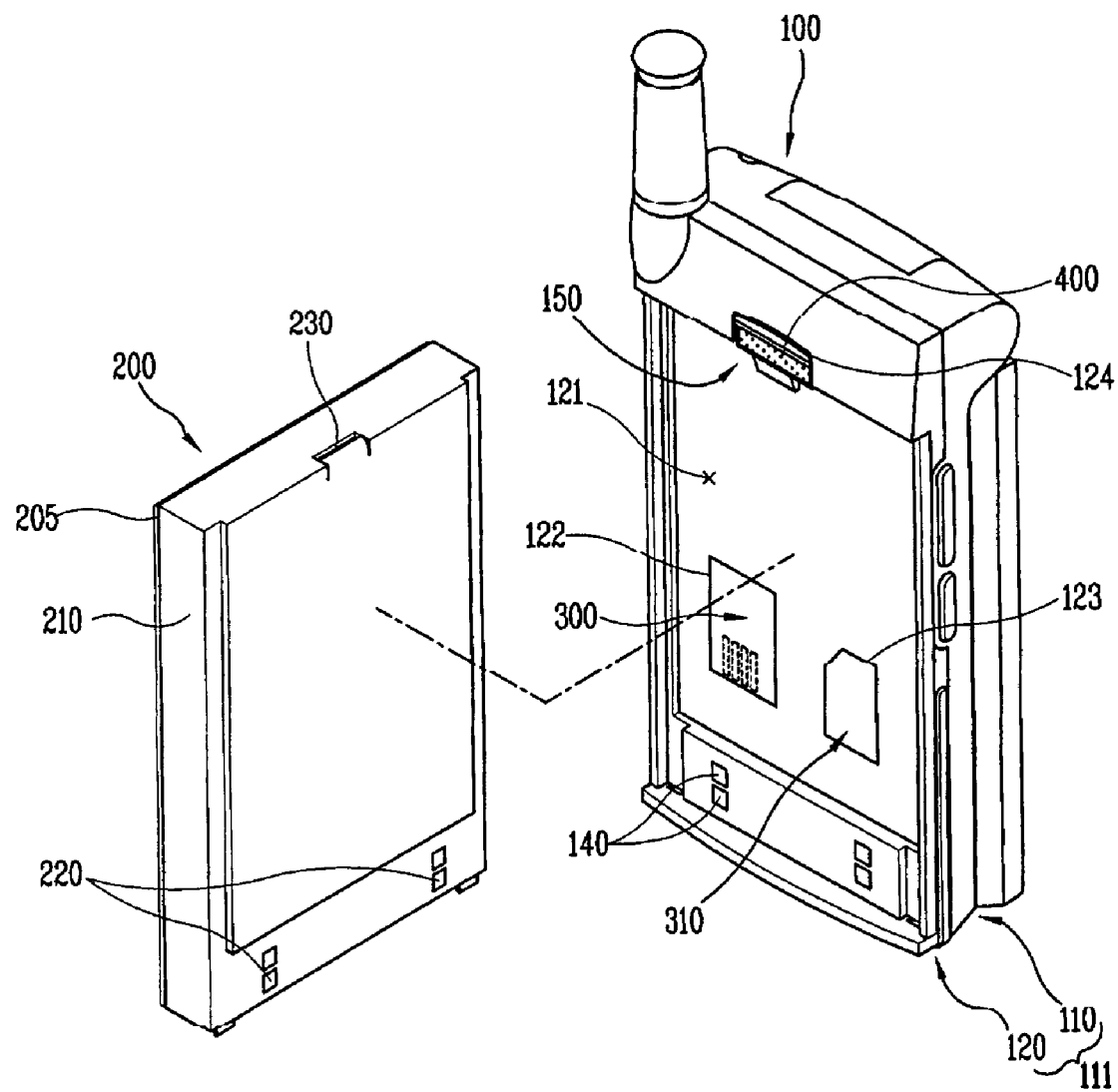
FIG. 4 is a disassembled perspective view showing a mobile handset having a static preventing device according to one embodiment of the present invention.
Figure 5:
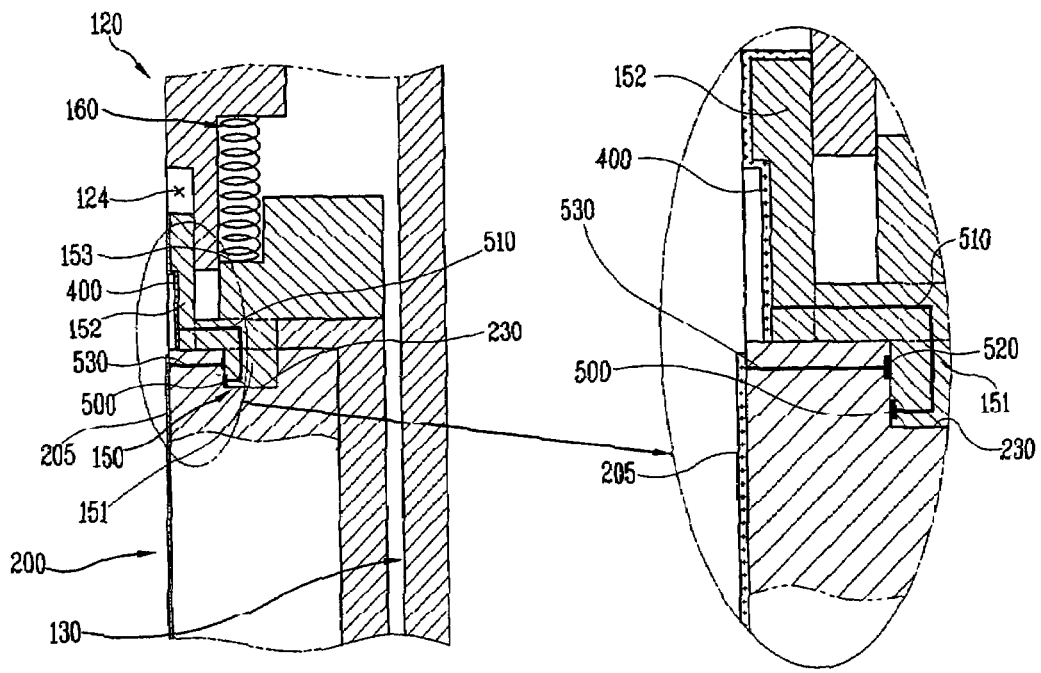
FIG. 5 is a sectional view showing the static preventing device according to one embodiment of the present invention.
Figure 6:
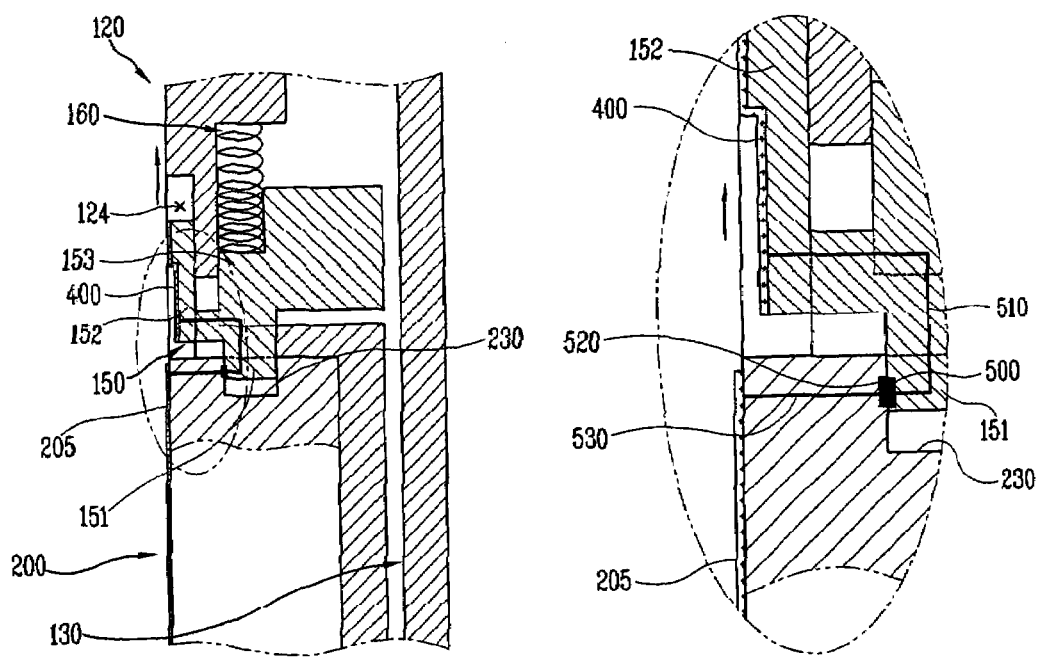
FIG. 6 is a sectional view showing an operation state of the mobile handset having a static preventing device according to another embodiment of the present invention.

FIG. 4 is a disassembled perspective view showing a mobile handset provided with a static preventing device according to one embodiment of the present invention, and FIG. 5 is a sectional view showing a mobile handset having a static preventing device according to one embodiment of the present invention. The same reference numerals denote the same parts as those of the conventional art.

As shown, the mobile handset comprises a body 100 having a certain shape, and a battery 200 for supplying power detachably coupled to one side of the body 100. The body 100 comprises a body casing 111 having a certain shape, a PCB 130 mounted in the body casing 111, and a key pad (not shown) mounted in the body casing 111. The body casing 111 comprises a front case 110 and a rear case 120 coupled to the front case 110. A compartment 121 for mounting the battery 200 is formed at the rear case 120.

Connection terminals 140 are formed on an inner side of the battery compartment 121, and the connection terminals 140 are connected to other components. A memory card slot 122 and a SIM card slot 123 are respectively formed on a surface of the battery compartment 121 for mounting a memory card 300 and a SIM card 310 respectively. The memory card 300 and the SIM card 310 are connected to chips inside the handset body 100 by signal lines in order to exchange data and signals.

Figure 3:
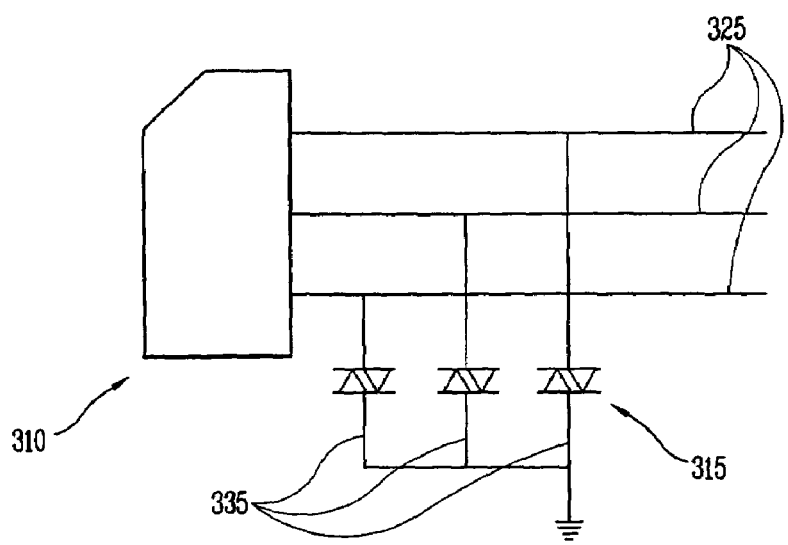
FIG. 3 is a block diagram showing a static preventing circuit of the mobile handset in accordance with the conventional art.

The signal lines connected to the memory card 300 and SIM 310 have a static preventing circuit as described in FIG. 3. Also, a battery latch for securing or releasing the battery 200 within the battery compartment 121 is provided at one side of the handset body 100.

The battery latch comprises a guide groove 124 having a certain length, a locking member 150 formed with a certain shape, and a spring 160 positioned in the handset body 100 for biasing the locking member 150 in the direction of the battery compartment 121. The guide groove 124 is penetratingly formed at one side of the handset body 100 and positioned at an edge of the battery compartment 121. The locking member 150 is coupled to the handset body 150 and is slideable within the guide groove 124.

The locking member 150 comprises a step portion 151 for insertion into the stopping groove 230 of the battery, a contact portion 152 for sliding within the guide groove 124 of the handset body, and a spring support portion 153. Spring 160 is disposed between locking member 150 and the handset body 100, and couples the locking member 150 to the handset body.

The battery 200 comprises a battery body 210 formed to have a certain thickness and area, connection terminals 220 formed at one side of the battery body 210, and a stopping groove 230 formed at one side of the battery body 210.

The battery 200 is mounted at the battery compartment 121 of the handset body 100, and the step portion 151 of the locking member 150 is inserted into or detached from the stopping groove 230 of the battery 200 as the locking member 150 moves.

A ground 205 for discharging static electricity is provided on the battery 200. The ground 205 is preferably formed of a thin film of an EMI material disposed on one surface of the battery 200.

A conductive contact plate 400 is provided on the contact portion 152 of the locking member 150. When the battery 200 is secured to or released from the battery compartment 121 by moving the locking member 150, a switching path conducts static electricity from the contact plate 400 to the ground 205 by connecting the contact plate 400 to the ground 205 provided at the battery 200.

The switching path comprises a first terminal 500, a first connection line for connecting the conductive contact plate 400 to the first terminal 500, a second terminal 520, and a second connection line 530 for connecting the second terminal 520 to the ground 205 provided at the battery 200. The first terminal 500 is formed on the step portion 151 of the locking member 150, and the first connection line 510 is formed in the locking member 150. The second terminal 520 is formed at an inner wall of the stopping groove 230, and the second connection 530 is formed within the battery body 210.

In a normal condition, the battery 200 is secured within the battery compartment 121, the spring 160 biases the locking member 150 into the stopping groove 230, and the first terminal 500 is not in contact with the second terminal 520. When the locking member 150 is moved to release the battery 500 from the battery compartment 121, the first terminal 500 contacts the second terminal 520 completing a discharge circuit from the conductive plate 400 to 205. Therefore a user in contact with the locking member 150 will discharge any accumulated static electricity to ground 205.

Operation of the mobile handset having a static preventing device according to the present invention is as follows:

When securing the battery 200 to the handset body 100, the battery 200 is placed in the battery compartment 121 while the user moves the locking member 150 in a direction away from the battery compartment 121. The locking member 150 then is released and the restoration force of the spring 160 biases the locking member 150 into the stopping groove 230 thereby securing the battery 200 into the handset body.

When releasing the battery 200 from the handset body 100, the user moves the locking member 150 in a direction away from the battery compartment 121 thereby moving the step portion 151 from the stopping groove 230. The battery 200 then may be removed from the battery compartment 121.

The memory card 300 and the SIM card 310 are removed from or inserted into their respective slots, 122 and 123, when the battery 200 is removed from the battery compartment 121.

At the time the user releases the battery 200, the user moves the locking member 150 having the conductive contact plate 400. In the process of moving the locking member 150, the conductive contact plate 400 is in electrical contact with ground 205 through the first contact 500 and the second contact 520 as described above. The static electricity generated by the user in contact with the conductive contact plate 400 is discharged to ground 205, Because static electricity is discharged while the battery 200 is being separated from the handset body 100, static electricity is prevented from being conducted to the handset body 100 components while inserting or removing the memory card 300 or the SIM card 310. If the static electricity is partially discharged, the residual static electricity is completely discharged by the static preventing circuit. Accordingly, static electricity is prevented from being introduced into the components located inside the handset body 100 through the memory card 300 or the SIM card 310.

Figure 7:
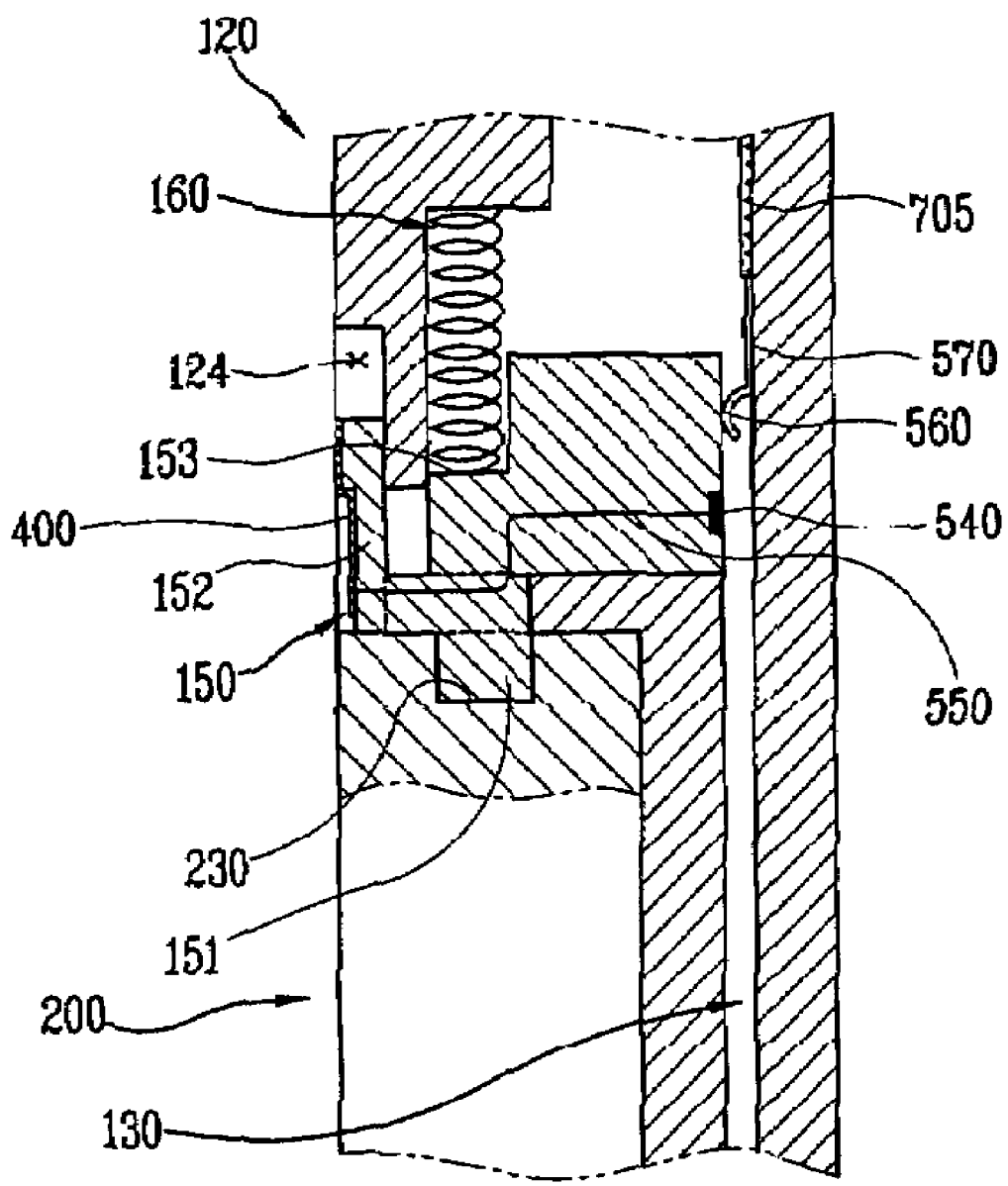
FIGS. 7 and 8 are sectional views respectively showing a mobile handset having a static preventing device according to yet other embodiments of the present invention.

FIG. 7 is a sectional view showing a mobile handset having a static preventing device according to another embodiment of the present invention. The same reference numerals denote the same parts as those of the aforementioned embodiment.

Figure 1:
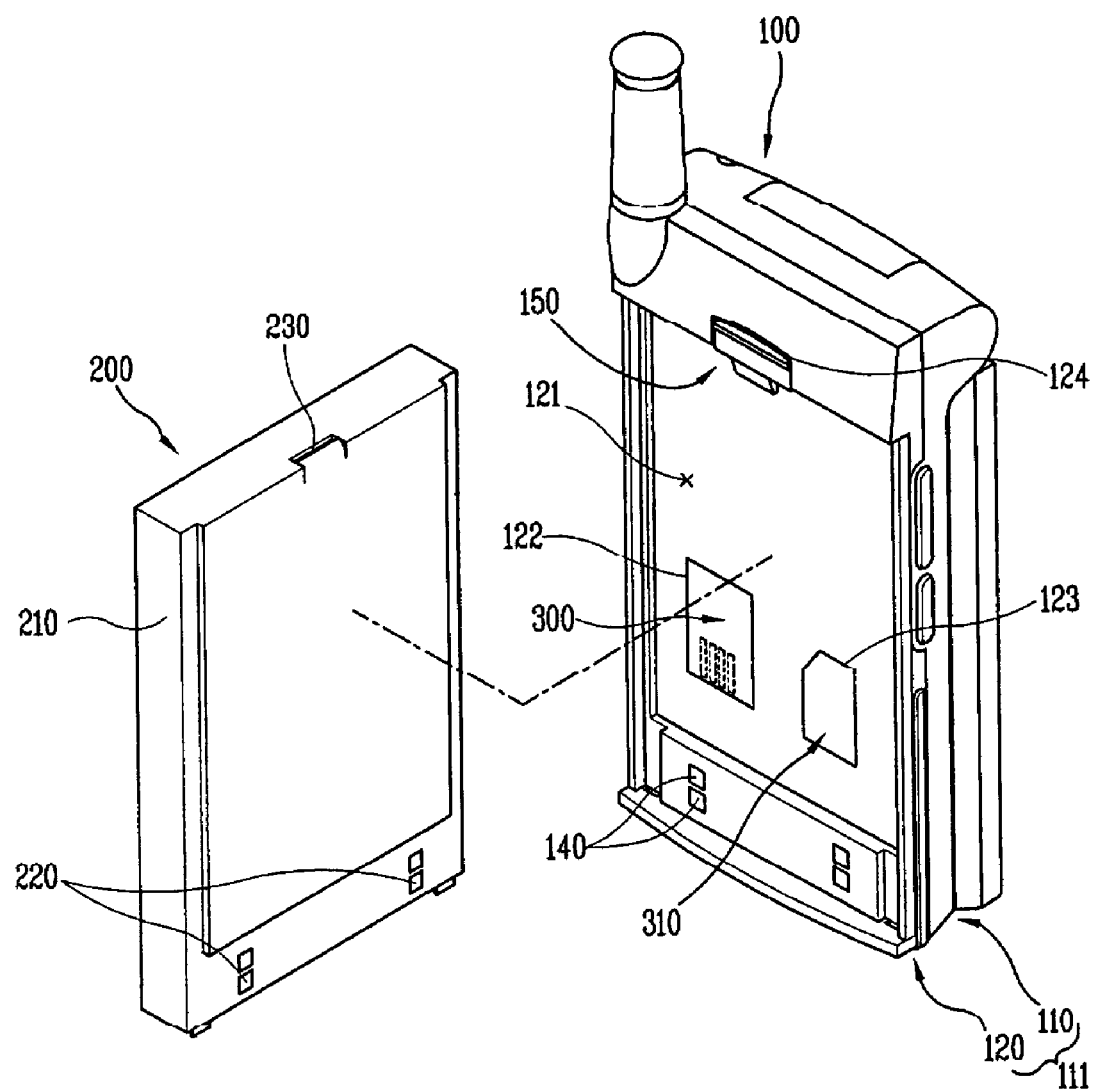
FIG. 1 is a disassembled perspective view showing a mobile handset in accordance with the conventional art.
Figure 2:
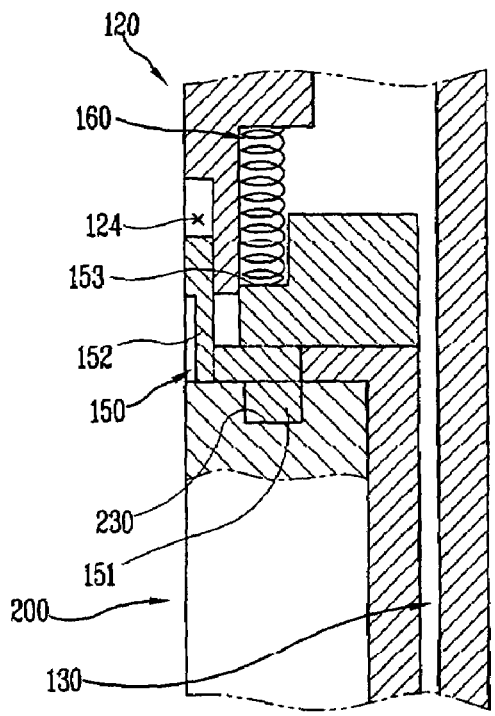
FIG. 2 is a partial sectional view showing the mobile handset.

As shown in FIG. 7, a switching path conducts static electricity from a user in contact with the conductive contact plate 400 located on locking member 150 to ground 705 located on the PCB 130 (see FIG. 2). Ground 705 may be formed of a thin film of an EMI material having a certain area applied to the PCB 130. The switching path comprises a third terminal 540 located on a rear surface of locking member 150, a fourth terminal 560 located on the PCB 130, a third connection line 550 located, and a fourth connection line 570 for connecting the fourth terminal to ground 705.

In a normal state, spring 160 biases the locking member 150 into the stopping groove 230, and the third terminal 540 is not in contact with the fourth terminal 560. When the user moves the locking member 150 to secure the battery 200 in or to release the battery 200 from the battery compartment 121, the third terminal 540 slidely contacts the fourth terminal 560 thereby completing the switching path from the user in contact with the conductive contact plate 400 to ground 705. Any static electricity generated by the users is conducted to ground 705.

Figure 8:
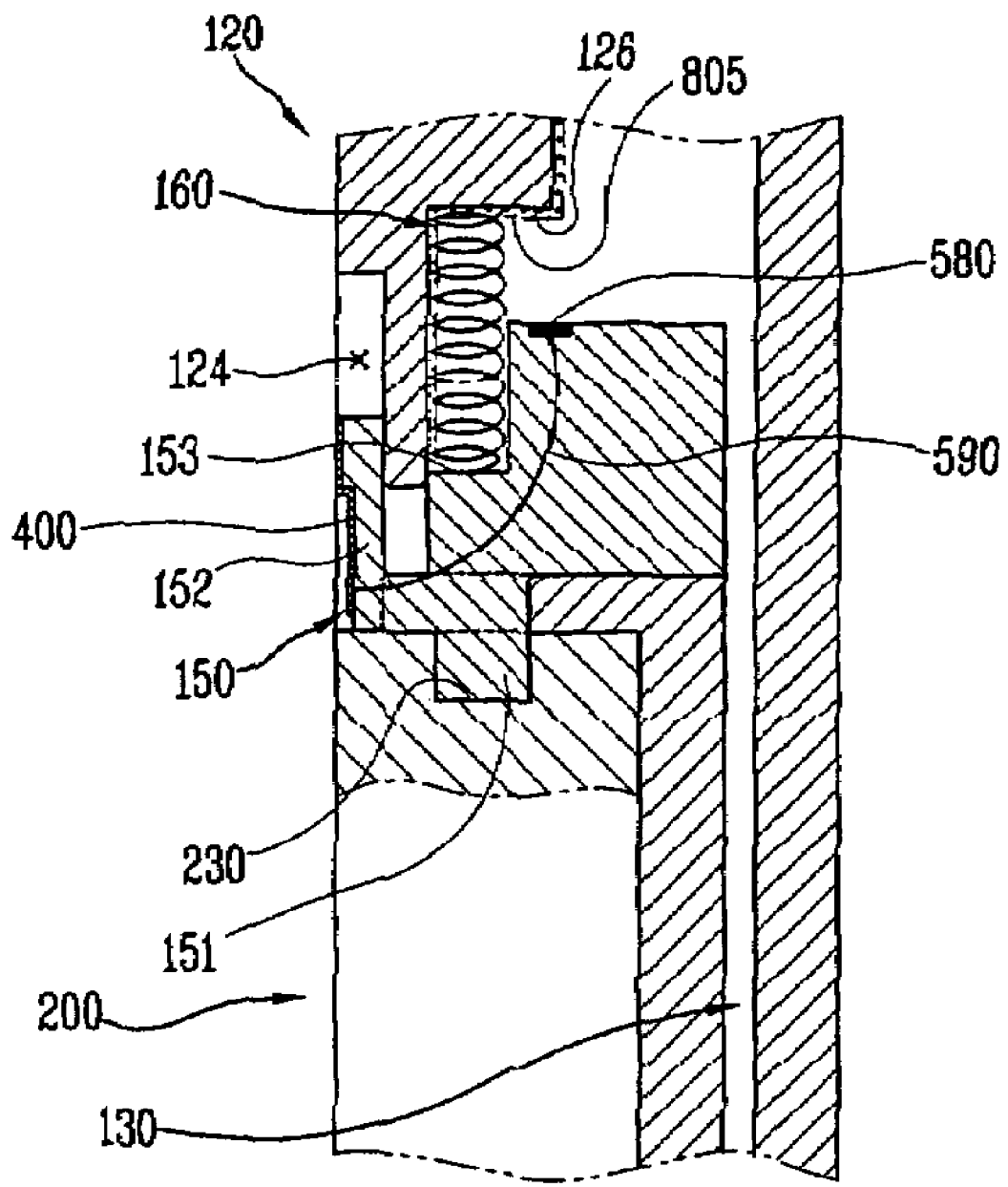

FIG. 8 is a sectional view showing a mobile handset having a static preventing device according to yet another embodiment of the present invention. The same reference numerals denote the same parts as those of the aforementioned embodiment.

The ground 805 may be provided at the body casing 111 of the handset body 100. As shown in FIG. 8, the switching path comprises a fifth terminal 580 formed at one side of the locking member 150, and a fifth connection line 590 for connecting the conductive contact plate 400 to the fifth terminal 580, and ground 805 formed on step surface 126 facing the fifth terminal 580. The step surface 126 is formed at the rear case 120 of the body casing. When the locking member 150 is moved to secure or to release the battery 200, the fifth terminal 580 comes in contact with ground 805 on the step surface 126. The ground 805 is preferably formed of a thin film EMI material applied on the step surface 126 of the rear case 120.

In a normal state, spring 160 biases the locking member 150 into the securing groove 200, and the fifth terminal 580 is not in contact with the ground 805. When the user moves the locking member 150 to secure or to release the battery 200 from the battery compartment 121, the fifth terminal 580 contacts the ground 805 thereby completing the switching path from the user in contact with the conductive contact plate 400 to ground 805. Any static electricity generated by the users is conducted to ground 805.

As mentioned above, according to the present invention, static electricity generated by the user is discharged while the battery is released from the handset body so that the user may insert or remove the memory card or the SIM card. Accordingly, static electricity is prevented from being conducted into the components inside the handset body through the memory card or the SIM card. Therefore, damage to the software and the hardware resulting from static electricity is prevented, thereby enhancing the reliability of the product.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A mobile handset having a static preventing device, the mobile handset comprising:
   a handset body;
   a battery mounted on the handset body;
   a locking member for securing the battery to the handset or for releasing the battery from the handset body, wherein the locking member is biased in a first position such that the battery is secured to the handset when the locking member is in the first position, and the battery is released from the handset when the locking member is in a second position;
   a conductive contact plate disposed externally on the locking member, wherein the locking member can be moved from the first position to the second position by a user contacting the conductive contact plate;
   a ground disposed externally on the battery for discharging static electricity; and
   a switching path for connecting the conductive contact plate to the ground, wherein the conductive contact plate is not connected to the ground when the locking member is in the first position and is connected to the ground when the locking member is in a second position, wherein the switching path comprises:

a first terminal provided on the locking member, wherein the first terminal is in electrical contact with the conductive contact plate, a second terminal provided on one side of the battery, wherein the second terminal is in electrical contact with the ground, and wherein the first terminal is in electrical contact with the second terminal when the locking member is in the second position.

2. A mobile handset having a static preventing device, the mobile handset comprising:

a handset body;

a battery mounted on the handset body;

a locking member for securing the battery to the handset or for releasing the battery from the handset body, wherein the locking member is biased in a first position such that the battery is secured to the handset when the locking member is in the first position, and the battery is released from the handset when the locking member is in a second position;

a conductive contact plate disposed externally on the locking member, wherein the locking member can be moved from the first position to the second position by a user contacting the conductive contact plate;

a ground disposed externally on the battery for discharging static electricity; and a switching path for connecting the conductive contact plate to the ground, wherein the conductive contact plate is not connected to the ground when the locking member is in the first position and is connected to the ground when the locking member is in a second position, wherein the ground is disposed externally on the handset body, and wherein the switching path comprises:

a first terminal provided on one side of the locking member, wherein the first terminal is in electrical contact with the conductive contact plate;

a second terminal provided on the handset body, wherein the second terminal is in electrical contact with the ground; and wherein the first terminal is in electrical contact with the second terminal when the locking member is in the second position.

3. A mobile handset having a static preventing device, the mobile handset comprising:

a handset body;

a battery mounted on the handset body;

a locking member for securing the battery to the handset or for releasing the battery from the handset body, wherein the locking member is biased in a first position such that the battery is secured to the handset when the locking member is in the first position, and the battery is released from the handset when the locking member is in a second position;

a conductive contact plate disposed externally on the locking member, wherein the locking member can be moved from the first position to the second position by a user contacting the conductive contact plate;

a ground disposed externally on the battery for discharging static electricity; and a switching path for connecting the conductive contact plate to the ground, wherein the conductive contact plate is not connected to the ground when the locking member is in the first position and is connected to the ground when the locking member is in a second position, wherein the ground is disposed externally on the handset body, wherein the ground is provided on a PCB of the handset body, and wherein the switching path comprises:

a first terminal formed on one side of the locking member, wherein the first terminal is in electrical contact with the conductive contact plate; and wherein the first terminal is in electrical contact with the ground when the locking member is in the second position.

4. The mobile handset of claim 1, wherein the ground is formed of a thin film EMI material.

* * * * *